United States Patent [19]
Wieting et al.

[11] Patent Number: 4,612,411
[45] Date of Patent: Sep. 16, 1986

[54] THIN FILM SOLAR CELL WITH ZNO WINDOW LAYER

[75] Inventors: Robert D. Wieting, Simi Valley; Richard R. Potter, Chatsworth, both of Calif.

[73] Assignee: Atlantic Richfield Company, Los Angeles, Calif.

[21] Appl. No.: 740,946

[22] Filed: Jun. 4, 1985

[51] Int. Cl.$^4$ ............................................. H01L 31/06
[52] U.S. Cl. ................................... 136/265; 29/572; 357/16; 357/30; 427/74; 427/86
[58] Field of Search ................... 136/265; 357/16, 30; 427/74, 86; 29/572

[56] References Cited
PUBLICATIONS

M. S. Tomar et al, *Thin Solid Films*, vol. 90, pp. 419–423 (1982).

*Primary Examiner*—Aaron Weisstuch
*Attorney, Agent, or Firm*—Albert C. Metrailer

[57] ABSTRACT

A thin film photovoltaic device comprising a first layer of copper indium diselenide p-type semiconductor and a second layer of n-type zinc oxide semiconductor. In a preferred form, the first portion of the zinc oxide film at the junction with the CIS is undoped to have relatively high resistivity, while the remaining portion thereof is doped to achieve low resistivity. The zinc oxide is preferably deposited by a low temperature chemical vapor deposition process.

11 Claims, 2 Drawing Figures

THIN FILM SOLAR CELL WITH ZNO WINDOW LAYER

BACKGROUND OF THE INVENTION

The present invention relates to thin film heterojunctions photovoltaic cells formed from compound semiconductors, especially cells having copper indium diselenide (CIS) as a first semiconductor layer, and more particularly to such cells in which the semiconductor forming the light receiving face comprises primarily zinc oxide (ZnO).

A known photovoltaic cell structure which is believed relevant to the present invention comprises a first layer of copper indium diselenide forming a junction with one or more layers of cadmium sulfide. The background of such cells is discussed in considerable detail in U.S. Pat. No. 4,335,266 issued to Mickelson et al on June 15, 1982, which patent is hereby incorporated by reference for all purposes. As generally discussed in that patent, this type of solar cell is believed by many to be a viable alternative solar cell. The efficiency of such compound semiconductor cells have been gradually increased as various improvements have been made. In addition, they offer the opportunity of reduced manufacturing cost.

The basic improvement taught by Mickelsen involves a new method for forming the copper indium diselenide layer so as to not have an adverse affect upon the cadmium sulfide layer when deposited. Mickelsen deposits this CIS layer in two distinct regions with the first having an excess of copper and the second having a deficiency thereof. Diffusion between the two layers is said to achieve a uniform CIS structure while avoiding defects such as pure copper nodules at or near the surface upon which the cadmium sulfide is to be deposited. Such copper nodules, and possibly other defects, can cause short circuiting of the later deposited cadmium sulfide layer to the back face electrode of the finished device.

Despite the improvements in the CIS layer claimed by Mickelsen, it has still been found necessary to deposit the cadmium sulfide portion of the cell in two distinct regions. The first is a 0.5 to 1.5 micron layer of essentially pure cadmium sulfide which is of n-type conductivity and high resistivity. The high resistivity character of this region is believed necessary to limit the effect of defects such as pure copper or metallic copper selenide nodules in the CIS layer. The cadmium sulfide layer is then completed by deposition of a 2 to 4 micron thick layer of cadmium sulfide which has been doped appropriately to provide low resistivity.

While various improvements have been made in such CIS-CdS cells, several basic problems remain. One problem is that the relatively thick cadmium sulfide layer absorbs a considerable amount of incoming light before it can reach the active junction area. This necessarily reduces device efficiency. In addition, it is well-known that cadmium is a highly toxic heavy metal. While there is no evidence that cadmium in the completed devices presents any danger to the environment or to the user, the material does cause certain hazards in the manufacturing process. Thus, manufacturing costs are increased by the extra time and equipment which must be employed to avoid any danger to employees manufacturing devices incorporating cadmium and to avoid any environmental damage.

Some of the problems inherent in use of CdS have been avoided in experimental devices in which a heterojunction has been formed between CIS and ZnO. See for example: "A ZnO/p-CuInSe$_2$ Thin Film Solar Cell Prepared Entirely by Spray Pyrolysis", M. S. Tomar and F. J. Garcia, Thin Solid Films, 90 (1982), pp 419-423; and "Chemical Vapor Deposited Copper Indium Diselenide Thin Film Materials Research" Final Report, March 1984, SERI/STR-211-2247. In the Tomar publication, ZnO was deposited on a SnO$_2$ coated glass substrate by spray pyrolysis at a temperature of from 350° C. to 550° C. After similar deposition of a CIS layer, photovoltaic response with about 2% efficiency was measured. In the SERI report, efficiency in the range of 2% to 3% was achieved by ion-beam sputtering of ZnO films onto CIS films deposited by a close space chemical vapor transport technique. Thus neither of these references indicates that commercially practical efficiency can be achieved when ZnO is used in place of CdS in a thin film CIS heterojunction cell.

SUMMARY OF THE INVENTION

Accordingly, an object of the present invention is to provide an improved heterojunction photovoltaic device having a first layer comprised primarily of copper indium diselenide forming a junction with a second layer comprising primarily zinc oxide.

A photovoltaic device according to the present invention includes a first thin film layer of semiconductor material formed primarily from copper indium diselenide and a second thin film layer of semiconductor material comprising primarily zinc oxide. In a preferred form, the zinc oxide material is formed in two layers, with the first comprising a relatively thin layer of high resistivity zinc oxide, and a second, relatively thick layer of zinc oxide which has been doped to provide low resistivity. In yet another preferred form of the invention, the zinc oxide is deposited by a low temperature chemical vapor deposition process.

DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
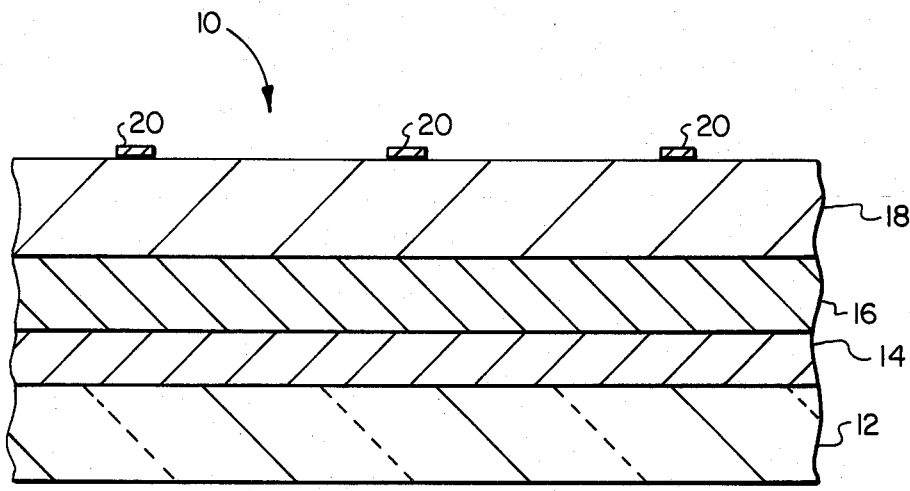
FIG. 1 is a cross-sectional illustration of a first embodiment of the present invention having a single zinc oxide layer deposited on a copper indium diselenide layer.

With reference now to FIG. 1, there is provided a cross-sectional illustration of a portion of a photovoltaic cell 10 according to the present invention. Cell 10 is structurally supported on a glass substrate 12 which is about 1 to 3 millimeters thick. A back contact comprises a metal layer 14 deposited upon substrate 12. Layer 14, in the preferred embodiment, is molybdenum which has been deposited by sputtering to a thickness of about 0.2 to 2 microns. The first active region of the device 10 comprises a semiconductor layer 16, which in the preferred embodiment, is primarily p-type copper indium diselenide having a thickness of about 0.2 to 2 microns.

The second active region of the device 10 comprises a semiconductor layer 18 having a thickness of from about 0.5 to 2 microns. In this embodiment, layer 18 comprises primarily n-type zinc oxide which has been appropriately doped to provide relatively low resistivity, for example, better than about $2.0 \times 10^{-3}$ ohm-cm, and preferably better than $1.0 \times 10^{-3}$ ohm-cm. The device is completed by a series of front face contacts 20 in the form of narrow metal strips which may be, for example, aluminum deposited by sputtering, evaporation, or plating.

While a device fabricated as illustrated in FIG. 1 has proved to be functional, its photovoltaic efficiency is rather low. This is believed to be due to defects in the CIS layer 16 which have an adverse affect on the device just as they have had on the CIS-CdS devices of Mickelsen et al. At this point, it has not been shown that "perfect" CIS layers can be deposited or that post-treatments of such layers can remove all defects. As a result, we believe it is preferred to incorporate a high resistivity zinc oxide layer in our device to overcome the defects in the CIS layer.

Figure 2:
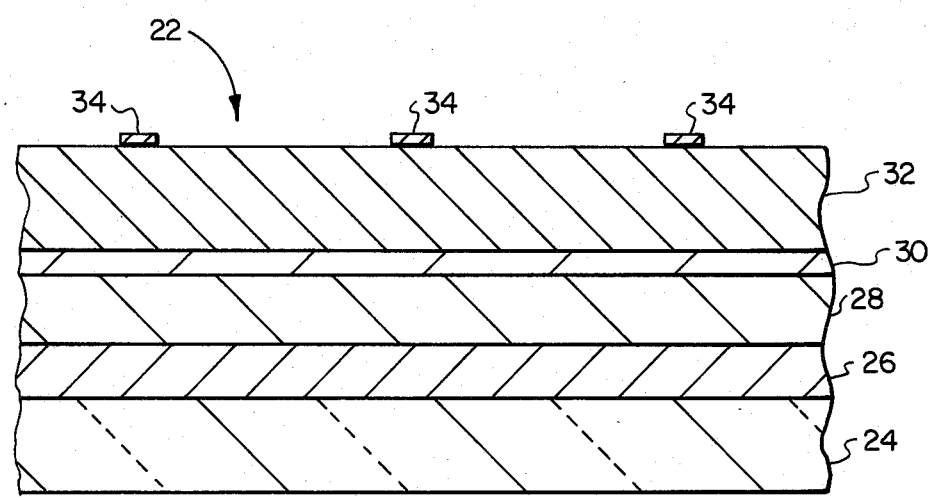
FIG. 2 is a cross-sectional illustration of a second embodiment of the present invention in which the zinc oxide layer has been deposited as two layers having different resistivities.

With reference to FIG. 2, there is illustrated a second embodiment of the present invention in which the zinc oxide layer is deposited as two distinct layers. In FIG. 2 the device 22 is constructed on a glass substrate 24 which may be identical to the substrate 12 of FIG. 1. Likewise, a molybdenum layer 26 and a CIS layer 28 may be identical to the layers 14 and 16 of FIG. 1. However, instead of using the single zinc oxide layer 18 of FIG. 1, the device 22 incorporates a first high resistivity zinc oxide layer 30 and a second low resistivity zinc oxide layer 32. Layer 30 may have a thickness ranging from 100 to 2000 angstroms while layer 32 has a thickness of about 10,000 angstroms. The high resistivity layer 30 is achieved by use of essentially pure zinc oxide material while layer 32 is doped to achieve low resistivity. Layer 30 preferably has a resistivity about two hundred times that of layer 32. For example where layer 32 has the preferred resistivity of about $1 \times 10^{-3}$ ohm-cm, layer 30 has a resistivity of about 0.2 ohm-cm. As in the FIG. 1 embodiment, a device 22 is completed by a series of front face contacts 34.

As indicated above, layers 12, 14 and 16 of FIG. 1 and layers 24, 26, and 28 respectively of FIG. 2 are essentially identical and may therefore be fabricated in essentially the same manner. For example, as indicated above, layer 26 of FIG. 2 is typically molybdenum, which may be applied to the glass substrate 24 by sputtering to a thickness of from 0.2 to 2 microns. The copper indium diselenide layer 28 may be deposited according to the process of the above-referenced Mickelsen et al patent, if desired. However, specific examples of the present invention have been fabricated using a copper indium diselenide layer 28 deposited by different processes. In these processes, layer 28 is formed by first depositing copper to a film thickness of about 2000 angstroms on metal layer 26. Thereafter, indium is deposited onto the copper film to a thickness of about 4000 angstroms. These layer thicknesses provide a desired atomic ratio of about 1.0. The copper and indium layers have been deposited both by electrodeposition from aqueous solutions and by sputtering from solid targets. After thus depositing copper and indium by either method, a copper indium diselenide semiconductor layer 28 is formed by "selenization". This process involves heating the substrate to approximately 400° C. in the presence of gas comprising about 3% $H_2Se$ diluted in argon for approximately one hour and thereafter annealing the material for an additional two hours at the same temperature. In this process, the copper and indium interdiffuse while selenium diffuses into and reacts with both the copper and indium. The result is a film of copper indium diselenide having a thickness of about 1 micron.

With reference now to FIG. 2, the preferred method for depositing a zinc oxide film on the copper indium diselenide layer will be described. This process is referred to as chemical vapor deposition (CVD) or as low temperature chemical vapor deposition (LTCVD). In this process, the substrate 24 with films 26 and 28 thereon is placed in a vacuum chamber on a heated support. The chamber is then evacuated and substrate temperature is adjusted to about 150° C. and allowed to stabilize for about 20 minutes. To form the high resistivity zinc oxide layer 30 on a substrate having an area of about 1 square foot, reactive gases comprising 8 sccm (standard cubic centimeters per minute) of diethyl zinc, 10 sccm $H_2O$, and 186 sccm of argon were flowed across the substrate at a pressure of 0.86 torr while the initial temperature was maintained. Flow rates of diethyl zinc and $H_2O$ were estimated from the flow rates of inert carrier gas streams, assuming saturation. For deposition times of from two to six minutes, high resistivity zinc oxide films may be deposited to thicknesses ranging between 700 and 2000 angstroms. While the resulting ZnO film is referred to herein as pure, or essentially pure, ZnO, it will be appreciated that the $H_2O$ contributes some hydrogen to the material and this probably has some effect on resistivity. When the desired thickness of high resistivity layer 30 has been deposited, deposition of the low resistivity layer of zinc oxide 32 is commenced by simply changing the reactive gas mixture. Doped layer 32 may be formed from a reactive gas comprising 8 sccm diethyl zinc, 10 sccm $H_2O$, 0.075 sccm $B_2H_6$, and 200 sccm argon. A high conductivity layer 32 having a thickness of about 1 micron may be deposited under these conditions in about 30 minutes process time.

While specific parameters are given above for the LTCVD process used to produce examples, good ZnO films can be achieved over a range of conditions. The substrate temperature can be varied from 60° C. to 350° C. and preferably from 100° C. to 200° C. Even at the 350° C. level, this is a low temperature process as compared to other methods of depositing transparent conductors and therefore is well suited for use with semiconductors. Vacuum system pressure can be varied from 0.1 torr to 2 torr, which range is not considered high vacuum. The chamber should, however, be capable of developing high vacuum levels to allow removal of all ambient gases from the chamber before deposition conditions are established. Other organozinc compounds having the formula $R_2Zn$, where R is a lower alkyl radical, for example dimethyl zinc $(CH_3)_2Zn$, may be used in place of the diethyl zinc $(C_2H_5)_2Zn$ specified above. Other oxygen sources, such as $O_2$ gas, may be useful in place of the $H_2O$ used in the preferred embodiment. Other inert gases, such as helium or possibly even nitrogen, could be used in place of argon as a carrier for the organozinc compound and water. The organozinc compound vapor and water vapor are preferably introduced into the vacuum chamber by bubbling the inert gas through a reservoir of the compound or deionized water. A mole ratio of water to organozinc compound greater than 1.0 is preferred to provide the proper reaction conditions.

With reference to FIG. 1, it can be seen that the zinc oxide layer 18 corresponds to the layer 32 of FIG. 2 and is deposited in the same manner. That is, the device of FIG. 1 is fabricated by the above-described process, except that the deposition of a high resistivity layer corresponding to layer 30 of FIG. 2 is omitted.

The devices of both FIGS. 1 and 2 are completed by deposition of a metal grid 20, 34 to the upper surface of layers 18 or 32 respectively. This grid may be formed from aluminum or silver metal deposited by any well-known method.

Several test devices having four square centimeters of area were fabricated as described above with reference to FIG. 2. Layer 30 had a estimated thickness of about 700 angstroms while layer 32 had a thickness of about 1 micron. At an insolation level of 100 mW/cm$^2$, devices in which the copper and indium were electrodeposited had efficiencies of between six and seven percent and those in which the copper and indium were sputtered had efficiencies exceeding seven percent. Similar devices with high resistivity layers 30 in the range of 100 to 200 angstroms also demonstrated reasonable photovoltaic response. Likewise, devices according to FIG. 1 in which no high resistivity zinc oxide layer is employed have shown photovoltaic response however with very low efficiency. Such low efficiency is believed to be due to defects in the copper indium diselenide layer.

While the layers 16 and 28 of FIGS. 1 and 2, respectively, are specified as copper indium diselenide, it will be appreciated that various other materials may be alloyed with this layer for various purposes. For example, it is known that aluminum, gallium, tellurium, or sulfur may be included in copper indium diselenide films to adjust bandgaps, and such alloyed materials would be considered equivalent to copper indium diselenide for the purposes of this invention. Likewise, the precise ratios of copper, indium, and selenium may be adjusted to improve the qualities of the final layer, for example, in attempts to eliminate pure copper nodules.

Likewise, while layer 18 of FIG. 1 and layers 30 and 32 of FIG. 2 are indicated as being zinc oxide, it will be appreciated that various materials may be added for various purposes. For example, as indicated above, both layers 18 of FIG. 1 and 32 of FIG. 2 include boron. In similar fashion, the particular reactive gases used to deposit zinc oxide in the preferred embodiment are believed to produce a certain amount of hydrogen doping in these layers. Hydrogen is provided both by the H$_2$O and the B$_2$H$_6$ gases. While boron is normally considered to increase the conductivity of semiconductors, we are not sure if this is true with ZnO and believe that the extra hydrogen contributed by the B$_2$H$_6$ gas may be the primary source of lower resistivity. Resistivity of ZnO may also be reduced by doping with aluminum, either alone or in combination with hydrogen. In addition, it is believed that the presence of sulfur in at least layer 30 of FIG. 2, and possibly layers 18 of FIG. 1 and 32 of FIG. 2, may improve open circuit voltage of the device and thereby improve overall efficiency. Sulfur can be incorporated into the layers simply by inclusion of hydrogen sulfide (H$_2$S) gas in the reactive gas used in the CVD process by which the zinc oxide films are deposited. In similar fashion, addition of selenium or tellurium to the ZnO layers may improve performance and can be accomplished by including H$_2$Se or H$_2$Te in the reactive gas mixture. The resulting films are still considered to be substantially zinc oxide according to the present invention.

In the above description, the CIS layer is referred to as being of p-type conductivity and is considered to form a junction at its physical interface with ZnO which is of n-type conductivity. However there is evidence that the junction in CIS devices is actually a buried homojunction between the bulk of the CIS layer and a thin n-type CIS layer at the surface which contacts the transparent layer. Such an n-type CIS layer may be formed by loss of selenium from the surface of the CIS layer caused by later processing steps, e.g. heating. This is one of the reasons that the low temperature ZnO deposition process is preferred and believed to provide better results.

While the present invention has been illustrated and described with reference to particular structures and methods of fabrication, it will be apparent that other changes and modifications can be made therein within the scope of the present invention as defined by the appended claims.

What is claimed is:

1. A thin film photovoltaic device comprising, in order, a first layer of copper indium diselenide semiconductor, a second layer of high resistivity zinc oxide semiconductor in contact with said first layer, and a third layer of low resistivity zinc oxide semiconductor in contact with said second layer.

2. A device according to claim 1 wherein the third layer is deposited by a chemical vapor deposition process and low resistivity is achieved by inclusion of B$_2$H$_6$ in the reactive gas mixture used to deposit the zinc oxide semiconductor.

3. A device according to claim 1 wherein said second layer is produced by a low temperature chemical vapor deposition process.

4. A device according to claim 3 wherein said process includes the steps of maintaining a substrate supporting said first layer at a temperature of from 60° C. to 350° C. while flowing reactant gases including water vapor and an organozinc compound at a pressure of from 0.1 to 2 torr across said first layer.

5. A device according to claim 4 wherein during said deposition process said substrate temperature is maintained at about 150° C. and said reactant gas pressure is maintained at about 0.86 torr.

6. A device according to claim 4 wherein said organozinc compound is diethyl zinc.

7. A thin film photovoltaic device having a first layer of copper indium diselenide forming a junction with a second layer comprising primarily zinc oxide wherein said zinc oxide layer is deposited on said first layer by a low temperature chemical vapor deposition process.

8. A device according to claim 7 wherein said process includes the steps of maintaining a substrate supporting said first layer at a temperature of from 60° C. to 350° C. while flowing reactant gases including water vapor and an organozinc compound at a pressure of from 0.1 torr to 2 torr across said first layer.

9. A device according to claim 8 wherein during said deposition process said substrate temperature is maintained at about 150° C. and said reactant gas pressure is maintained at about 0.86 torr.

10. A device according to claim 8 wherein said organozinc compound is diethyl zinc.

11. A device according to claim 8 wherein the portion of said zinc oxide layer remote from said junction has low resistivity achieved by inclusion of B$_2$H$_6$ in the reactive gas mixture used to deposit the zinc oxide layer.

* * * * *